US010381177B2

(12) United States Patent
Wakuda

(10) Patent No.: US 10,381,177 B2
(45) Date of Patent: Aug. 13, 2019

(54) PUSH SWITCH, METHOD OF MANUFACTURING PUSH SWITCH, AND ELECTRONIC DEVICE INCLUDING PUSH SWITCH

(71) Applicants: CITIZEN ELECTRONICS CO., LTD., Yamanashi-ken (JP); CITIZEN WATCH CO., LTD., Tokyo (JP)

(72) Inventor: Ryo Wakuda, Kofu (JP)

(73) Assignees: CITIZEN ELECTRONICS CO., LTD., Yamanashi-ken (JP); CITIZEN WATCH CO., LTD., Tokyo (JP)

( * ) Notice: Subject to any disclaimer, the term of this patent is extended or adjusted under 35 U.S.C. 154(b) by 11 days.

(21) Appl. No.: 15/457,002

(22) Filed: Mar. 13, 2017

(65) Prior Publication Data

US 2017/0263391 A1  Sep. 14, 2017

Related U.S. Application Data

(60) Provisional application No. 62/307,737, filed on Mar. 14, 2016.

(51) Int. Cl.
*H01H 13/83* (2006.01)
*H01H 13/02* (2006.01)
*H05K 1/18* (2006.01)
*H01H 15/00* (2006.01)

(52) U.S. Cl.
CPC .......... *H01H 13/83* (2013.01); *H01H 13/023* (2013.01); *H01H 15/005* (2013.01); *H05K 1/181* (2013.01); *H01H 2219/062* (2013.01);
*H01H 2227/032* (2013.01); *H05K 2201/10053* (2013.01); *H05K 2201/10106* (2013.01); *Y02P 70/611* (2015.11)

(58) Field of Classification Search
CPC ........... H01H 13/023; H01H 2203/038; H01H 2227/022; H01H 2227/026; H01H 13/83; H01H 1/5805; H01H 2001/5811
See application file for complete search history.

(56) References Cited

U.S. PATENT DOCUMENTS 4,412,113 A * 10/1983 Mitsugi .................. H01H 13/48
  200/242
7,449,654 B2 * 11/2008 Tsuduki ................ G06F 3/0338
  200/406

(Continued)

FOREIGN PATENT DOCUMENTS

JP  2011-142053  7/2011

*Primary Examiner* — Felix O Figueroa
(74) *Attorney, Agent, or Firm* — Wenderoth, Lind & Ponack, L.L.P.

(57) ABSTRACT

A push switch includes a substrate including a first electrode and a second electrode that are arranged on an upper surface of the substrate; a resilient member arranged on the first electrode over the second electrode of the substrate; and a light-transmitting member including a crosslinked product of a chain olefin-cyclic olefin copolymer. The light-transmitting member covers the resilient member from above and includes an upper surface, a lower surface, a peripheral side surface between edges of the upper surface and edges of the lower surface of the light-transmitting member, and a periphery of the lower surface of the light-transmitting member. The periphery may be fixed on the substrate.

15 Claims, 10 Drawing Sheets

(56) References Cited

U.S. PATENT DOCUMENTS

| | | | |
|---|---|---|---|
| 7,485,824 B2* | 2/2009 | Rastemborski | H01H 13/48 200/406 |
| 7,816,615 B2* | 10/2010 | Yanai | H01H 13/48 200/406 |
| 9,206,278 B2* | 12/2015 | Yoshida | C08F 8/00 |
| 9,813,059 B2* | 11/2017 | Chu | H03K 17/9622 |
| 2001/0052452 A1* | 12/2001 | Yokobori | H01H 5/30 200/406 |
| 2003/0199180 A1 | 10/2003 | Koizumi et al. | |
| 2006/0169991 A1 | 8/2006 | Kikuchi | |
| 2009/0200147 A1* | 8/2009 | Watanabe | H01H 13/023 200/406 |
| 2014/0044950 A1 | 2/2014 | Umemoto et al. | |
| 2018/0218856 A1* | 8/2018 | Ito | H01H 13/02 |

* cited by examiner

PUSH SWITCH, METHOD OF MANUFACTURING PUSH SWITCH, AND ELECTRONIC DEVICE INCLUDING PUSH SWITCH

CROSS-REFERENCE TO RELATED APPLICATION

This application is a new U.S. patent application that claims benefit of U.S. provisional application No. 62/307,737 filed on Mar. 14 2016, the disclosures of which are incorporated herein by reference in its entirety.

BACKGROUND

Field

The present disclosure relates to a push switch and an electronic device including the push switch.

For example, various electronic devices include push switches. Various electronic devices may be personal computers, portable communication devices, wearable devices, game consoles, and consumer electronics, for example. Also, push switches may be used in vehicles.

Description of the Related Art

It has been open to the public that a conventional switch member including a laminate sheet containing a hard layer composed of a resin component, and a soft layer which is laminated on at least one surface of the hard layer and is composed of a chain olefin-cyclic olefin copolymer (For reference, see Japanese Unexamined Patent Application Publication No. 2011-142053, for example).

Also, it has been open to the public that a crosslinked product of cyclic olefinic polymer and process for producing the crosslinked product (For reference, see US Patent Application Publication No. 2014/0044950, for example).

Furthermore, it has been open to the public that an LED (light-emitting diode) including an elastic connector integrated with an electrode (For reference, see US patent application publication No. 2003199180).

In addition, it has been open to public that a light-emitting diode including a conductive elastic member (For reference, see US patent application publication No. 2006-169991).

SUMMARY

In a first aspect of the present disclosure, a push switch includes a substrate that includes electrodes including a first electrode and a second electrode arranged on an upper surface of the substrate; a resilient member arranged on the first electrode over the second electrode of the substrate; and a light-transmitting member including a crosslinked product of a chain olefin-cyclic olefin copolymer. The light-transmitting member covers the resilient member from above. The light-transmitting member includes an upper surface, a lower surface and a peripheral side surface between edges of the upper surface and edges of the lower surface of the light-transmitting member. The lower surface of the light-transmitting member includes a periphery that may be fixed on the substrate.

In a second aspect of the present disclosure, a method of manufacturing a push switch includes: irradiating a chain olefin-cyclic olefin copolymer with an electron beam for crosslinking to prepare a light-transmitting member comprising a crosslinked product of a chain olefin-cyclic olefin copolymer; preparing a substrate comprising electrodes that comprises a first electrode and a second electrode arranged on an upper surface of the substrate; arranging a resilient member on the first electrode over the second electrode of the substrate; arranging the light-transmitting member over the resilient member and fixing a lower periphery of the light-transmitting member on the upper surface of the substrate; and electrically mounting a light-emitting element on the substrate such that the light-emitting element is arranged adjacent to the periphery of the light-transmitting member.

DETAILED DESCRIPTION OF EMBODIMENTS

As used herein, the term "and/or" includes any and all combinations of one or more of the associated listed items.

The terminology used herein is for the purpose of describing particular embodiments only and is not intended to be limiting of the subject matter. As used herein, the singular forms "a", "an" and "the" are intended to include the plural forms as well, unless the context clearly indicates otherwise.

As illustrated in the figures submitted herewith, some sizes of structures or portions may be exaggerated relative to other structures or portions for illustrative purposes. Relative terms such as "below" or "above" or "upper" or "lower" may be used herein to describe a relationship of one element, layer or region to another element, layer or region as illustrated in the figures. It will be understood that these terms are intended to encompass different orientations of a device in addition to the orientation depicted in the figures. Embodiments of the invention are described with reference to drawings included herewith. Same and/or similar reference numbers basically refer to same and/or similar structures throughout, however, depending on an element and/or an embodiment, same and/or similar reference numbers may sometimes refer to a different structure with a description in respective embodiments. It should be noted that the drawings are schematic in nature.

A push switch 100 according to a first embodiment of the subject matter will be described with reference to FIGS. 1A to 1F, and 2A to 2B.

The push switch 100 includes a pressing member 8. The pressing member 8 may include a sign, however the sign "A" on the pressing member 8 in Figures herein is just an example. The sign may be a character, a number, and/or a required indication. Also, such a sign depends on a design of an electronic device in which a push switch is arranged, and therefore, may be not necessary.

Figure 1A:
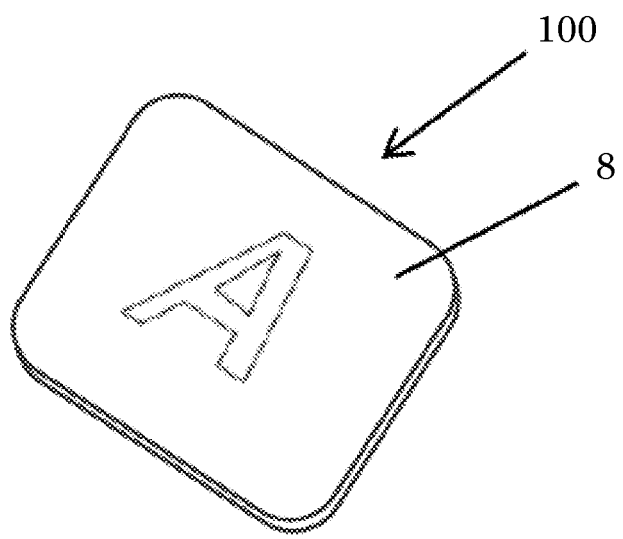
FIG. 1A is a top perspective view of a push switch according to a first embodiment of the subject matter.
Figure 1B:
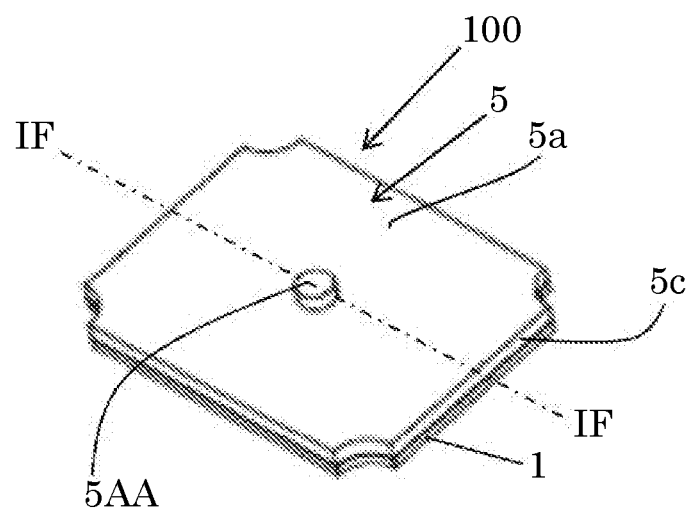
FIG. 1B is a top perspective view of the push switch with a pressing member in FIG. 1A removed from the push switch.

In FIG. 1B, the pressing member 8 is removed from the push switch 100.

A push switch according to an embodiment of the present disclosure includes a light-transmitting cover, which is less susceptible to heat than a light-transmitting cover containing a silicone.

The push switch 100 includes a substrate 1. The substrate 1 includes electrodes including a first electrode 2 and a second electrode 3 that may be arranged on an upper surface 1a of the substrate 1. The substrate may have a plate shape. Also, the substrate may have a shape of casing. Furthermore, the electrodes including a first electrode and a second electrode may be partly arranged in and/or on the substrate.

Figure 1C:
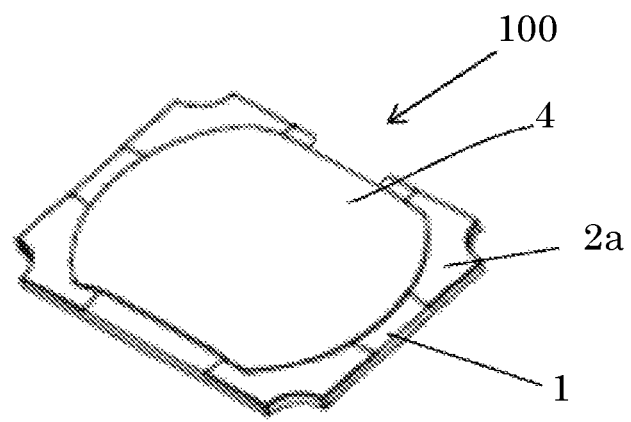
FIG. 1C is a top perspective view of the push switch with a light-transmitting member in FIG. 1B removed from the push switch.

As in FIG. 1C, the push switch 100 further includes a resilient member 4 arranged on the first electrode 2 over the second electrode 3 of the substrate 1. As in FIG. 1B, the push switch 100 includes a light-transmitting member 5 that contains a crosslinked product of a chain olefin-cyclic olefin copolymer.

Figure 1D:
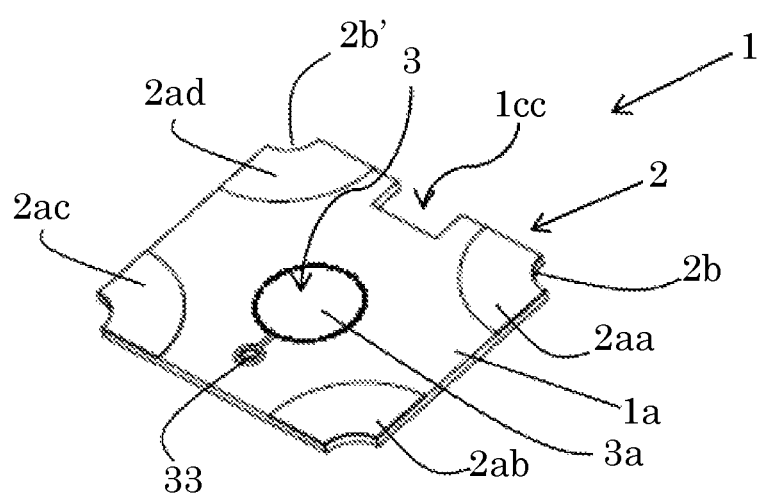
FIG. 1D is a top perspective view of a substrate of the push switch with a resilient member in FIG. 1C removed from the push switch.
Figure 1E:
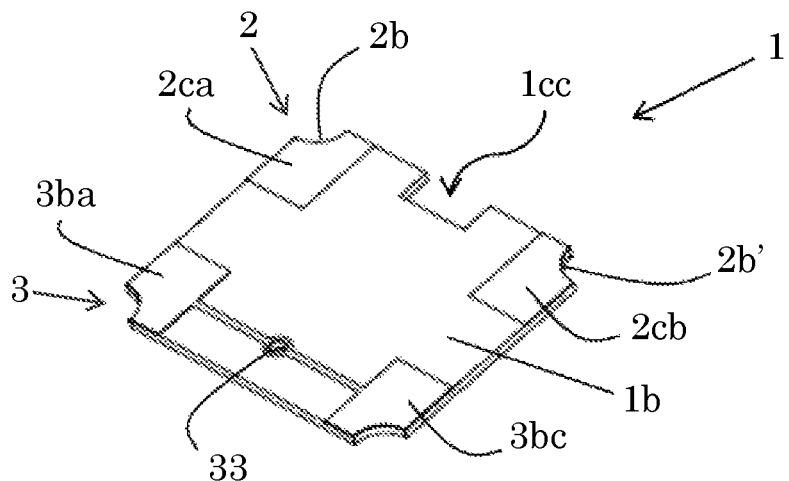
FIG. 1E is a bottom perspective view of the substrate in FIG. 1D.
Figure 1F:
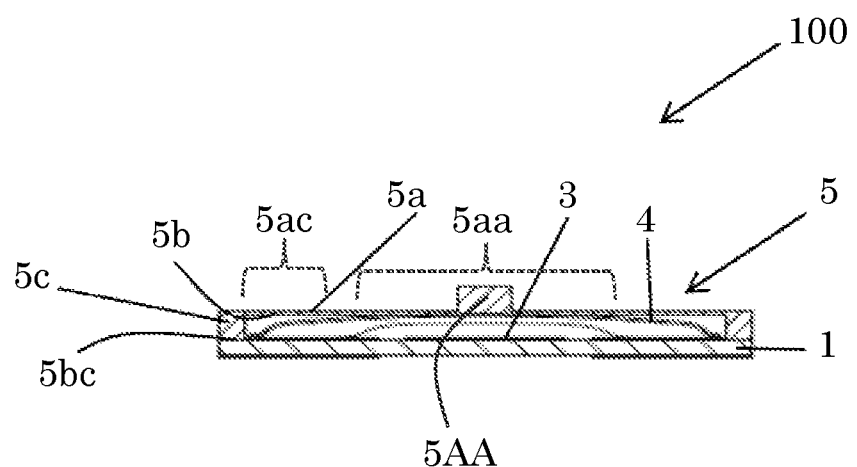
FIG. 1F is a cross-sectional view of the push switch taken along a dot and dash line IF of FIG. 1B.
Figure 2A:
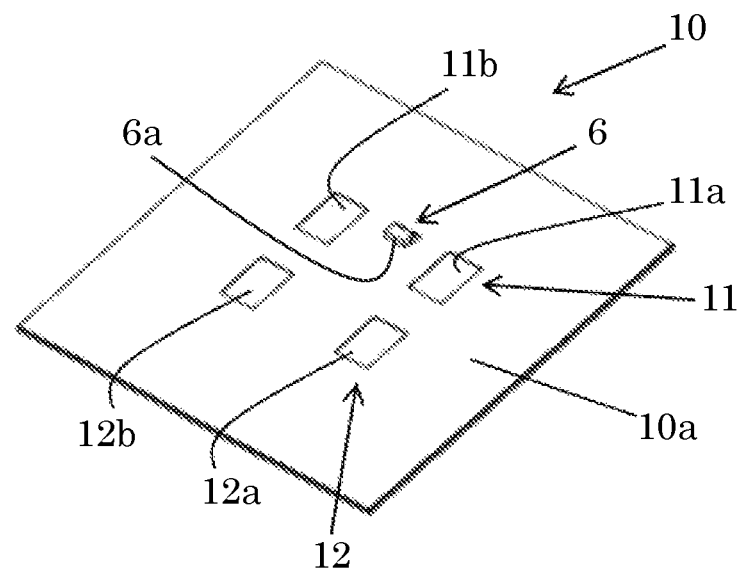
FIG. 2A is a perspective view of a motherboard of an electronic device.
Figure 2B:
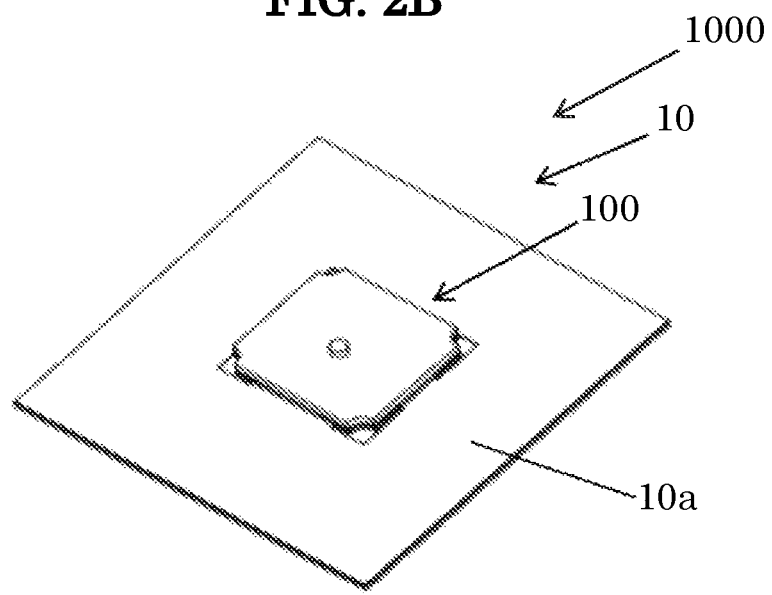
FIG. 2B is a perspective view of the push switch of the first embodiment electrically mounted on the motherboard of the electronic device.

As in FIG. 1F, the light-transmitting member 5 covers the resilient member 4 from above. The light-transmitting member 5 includes an upper surface 5a, a lower surface 5b and a peripheral side surface 5c between edges of the upper surface 5a and edges of the lower surface 5b of the light-transmitting member 5, a periphery 5bc of the lower surface 5b of the light-transmitting member 5 is fixed on the upper surface 1a of the substrate 1.

The light-transmitting member 5 may be a transparent film. The light-transmitting member 5 may transmit 80 percent or more light that is a visible light. The visible light may fit in a wavelength range of 400 nm to 800 nm.

The light-transmitting member 5 may be in a size range of 5 mm square to 6 mm square. The light-transmitting member 5 may have a shape with a corner removed.

In FIG. 1C, the light-transmitting member 5 is removed from the push switch 100. In FIG. 1D, the resilient member 4 is removed from the push switch 100.

The resilient member 4 is arranged on an upper electrode 2aa, 2ab, 2ac, and/or 2ad of the first electrode 2 over an upper electrode 3a of the second electrode 3 of the substrate 1. The upper electrode 3a of the second electrode 3 of the substrate 1 is positioned adjacent to a center of the upper surface 1a of the substrate 1.

A light-emitting element 6 may be electrically mounted on the substrate 1 of the push switch 100. Instead, as in FIGS. 2A and 2B, the light-emitting element 6 may be electrically mounted on a motherboard 10 at a position adjacent to the push switch 100. In this case, the substrate 1 of the push switch 100 includes a cut portion 1cc in which the light-emitting element 6 that is mounted on the motherboard 10 is to be positioned. With this configuration, it is possible to electrically mount the push switch 100 on the motherboard 10 such that the light emitting surface 6a of the light-emitting element 6 faces a part of the periphery 5c of the light-transmitting member 5.

In this embodiment, the upper electrode 2aa of the first electrode 2 is electrically connected to a lower electrode 2ca of the first electrode 2 by a through-hole 2b. The through-hole 2b may be a ¼ through-hole arranged at a first corner of the substrate 1. Also, the upper electrode 2ad of the first electrode 2 is electrically connected to a lower electrode 2cb by a through-hole 2b'. The through-hole 2b' may be a ¼ through-hole arranged at a second corner of the substrate 1.

In this embodiment, the upper electrode 3a of the second electrode 3 may be electrically connected to a lower electrode 3ba and/or 3bc by a through-hole 33 that passes through the substrate 1 from the upper surface 1a and the lower surface 1b.

However, this arrangement of electrode and through-hole is just an example. It is possible to change and select a design, arrangement, and number of electrodes and through-holes.

As in FIG. 1F, the light-transmitting member 5 may be a light-transmitting film with a central portion 5aa that is thinner than a peripheral portion 5ac of the light-transmitting member 5. In this embodiment, the light-transmitting member 5 may include a protruding portion 5AA at a center of the central portion 5aa on an upper surface 5a of the light-transmitting member 5. The protruding portion 5AA at the center of the central portion 5aa on the upper surface 5a of the light-transmitting member 5 may increase a clicking sensation to a user who will press down the push switch.

Also, the push switch 100 may include a light-emitting element 6 with a light-emitting surface 6a arranged to face a part of the periphery 5c of the light-transmitting member 5.

The first electrode 2 may include an upper electrode 2aa, 2ad arranged on an upper surface 1a of the substrate 1 and a lower electrode 2ca, 2cb arranged on a lower surface 1b of the substrate 1.

The lower surface 5b of the light-transmitting member 5 covers the resilient member 4 and the periphery 5bc of the lower surface 5b of the light-transmitting member 5 may be fixed on the substrate 1. The light-transmitting member 5 may be elastic. The resilient member 4 is made of metal and springy. The periphery 5bc of the lower surface 5b of the light-transmitting member 5 may be fixed on the upper surface 1a of the substrate 1.

Figure 3:
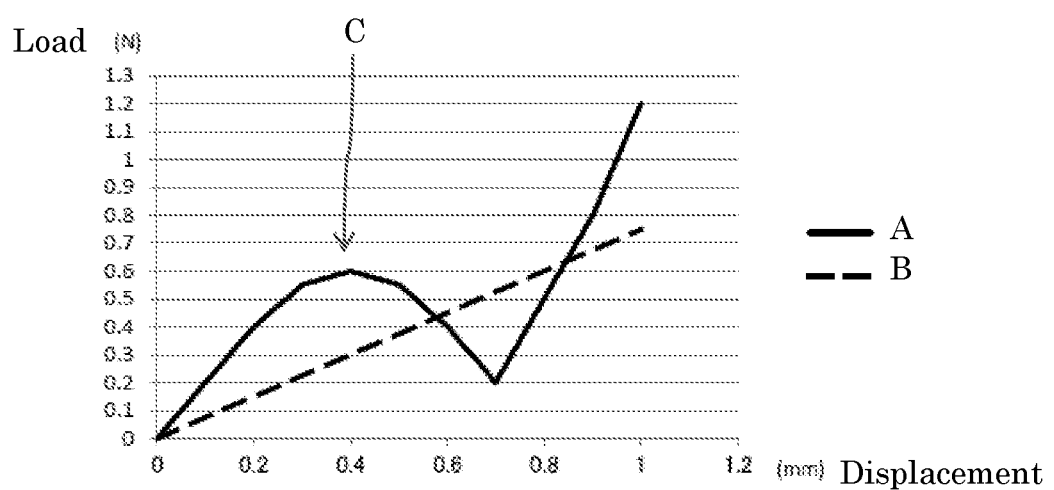
FIG. 3 is a line chart in which a vertical axis shows a load and a horizontal axis shows displacement. The graph includes a first line A, which is a solid line, shows a load-displacement relationship of a center top portion of the resilient member. The graph includes a second line B, which is a line that connects the zero point on the vertical axis and the horizontal axis of the graph and runs on a point of 50 percent of the load point C where the center top portion of the resilient member starts to reverse.

FIG. 3 is a schematic line chart in which a vertical axis shows a load and a horizontal axis shows displacement. The graph includes a first line A, which is a solid line, shows a load-displacement relationship of a center top portion of the resilient member. The graph includes a second line B, which is a reference line that connects zero point on the vertical axis and the horizontal axis of the graph and a point of 50 percent of the load point where the center top portion of the resilient member starts to reverse.

Also, a method of manufacturing a push switch includes irradiating a chain olefin-cyclic olefin copolymer with an electron beam for crosslinking to prepare a light-transmitting member including a crosslinked product of a chain olefin-cyclic olefin copolymer. The method of manufacturing a push switch may further include preparing a substrate 1 including electrodes that include a first electrode and a second electrode arranged on an upper surface 1a of the substrate 1, arranging a resilient member 4 on the first electrode over the second electrode of the substrate 1, arranging the light-transmitting member 5 over the resilient member 4 and fixing a lower periphery 5bc of the light-transmitting member 5 on the substrate 1, and electrically mounting a light-emitting element 6 on the substrate 1 such that the light-emitting element 6 is arranged adjacent to the periphery 1c of the light-transmitting member 5.

Furthermore, an electronic device 1000 includes a motherboard 10 including electrodes. The electrodes of the motherboard 10 may include a first electrode 11 and a second electrode 12.

The lower electrode 2ca, 2cb of the first electrode 2 of the push switch 100 may be soldered to the first electrode 11a, 11b of the motherboard 10. The lower electrode 3ba, 3bc of the second electrode 3 of the switch 100 may be soldered to the second electrode 12a, 12b of the motherboard 10. The electronic device 1000 further includes a light-emitting element 6 electrically mounted on the motherboard 10. The light-emitting element 6 with a light-emitting surface 6a may be arranged to face a part of the periphery 5c of the light-transmitting member 5 of the push switch 100.

Also, a method of manufacturing an electronic device 1000 including a push switch 100 includes preparing the push switch 100. The preparing the push switch 100 may include exposing a resin containing a chain olefin and a cyclic olefin that is in a shape of a film to an electron beam to form a light-transmitting member, preparing a substrate 1 including electrodes that include a first electrode and a second electrode arranged on an upper surface 1a of the substrate 1, arranging a resilient member 4 on the first electrode 11 over the second electrode 12 of the substrate 1, and arranging the light-transmitting member 5 over the resilient member 4 and at least partly fixing a periphery of the light-transmitting member 5 on the upper surface of the substrate. The method of manufacturing the electronic device including the push switch further includes: preparing a motherboard including electrodes that include a first electrode and a second electrode arranged on an upper surface of the motherboard; and electrically mounting a light-emitting element on a motherboard adjacent to a position where the switch is to be mounted, and soldering the push switch on the motherboard by solder that is heated at 250° C. or more for 8 seconds or more. Just as an example, a push switch may be heated to 260° C. for 10 seconds, when the push switch is electrically mounted and soldered on the motherboard by solder.

Since the light-transmitting member 5 in this embodiment is less susceptible to heat than a light-transmitting cover containing a silicone, and thus, the push switch 100 including the light-transmitting member 5 is able to be soldered onto the motherboard 10, which requires a high-heat temperature that is 250° C. or more with the duration of heating for eight or more seconds.

Next, the inventor suggests a second embodiment of a push switch, which is electrically mountable on a motherboard without a solder.

A push switch 200 according to a second embodiment of the subject matter will be described with reference to FIGS. 4A to 4F, and 5A to 5C.

Figure 4A:
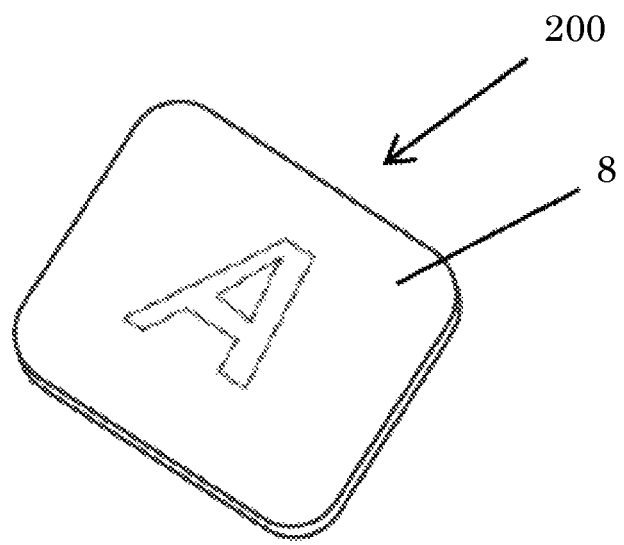
FIG. 4A is a top perspective view of a push switch according to a second embodiment of the subject matter.
Figure 4B:
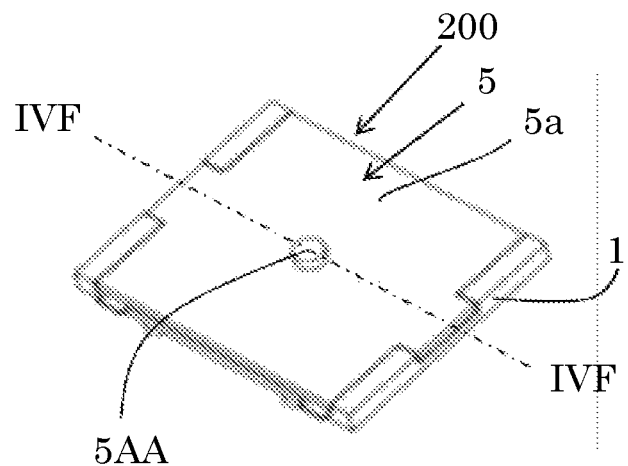
FIG. 4B is a top perspective view of the push switch with a pressing member in FIG. 4A removed from the push switch.

In FIG. 4B, a pressing member 8 in FIG. 4A is removed from the push switch 200. The push switch 200 includes a substrate 1.

Figure 4C:
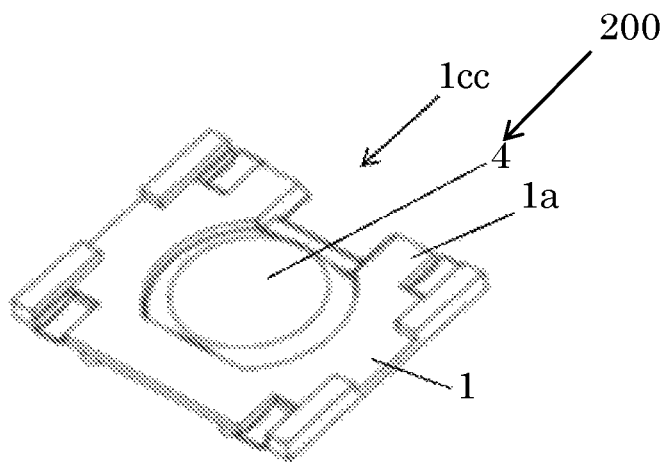
FIG. 4C is a top perspective view of the push switch with a light-transmitting member in FIG. 4B removed from the push switch.

In FIG. 4C, a light-transmitting member 5 in FIG. 4B is removed from the push switch 200.

Figure 4D:
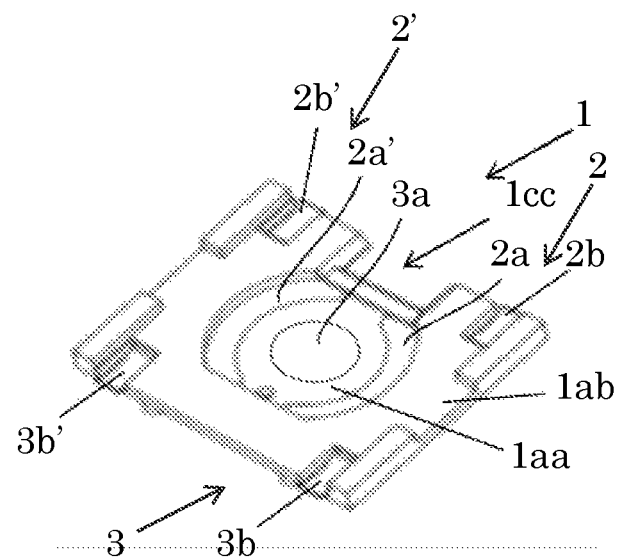
FIG. 4D is a perspective view of an upper surface of a substrate of the push switch with a resilient member in FIG. 4C removed from the push switch.
Figure 4E:
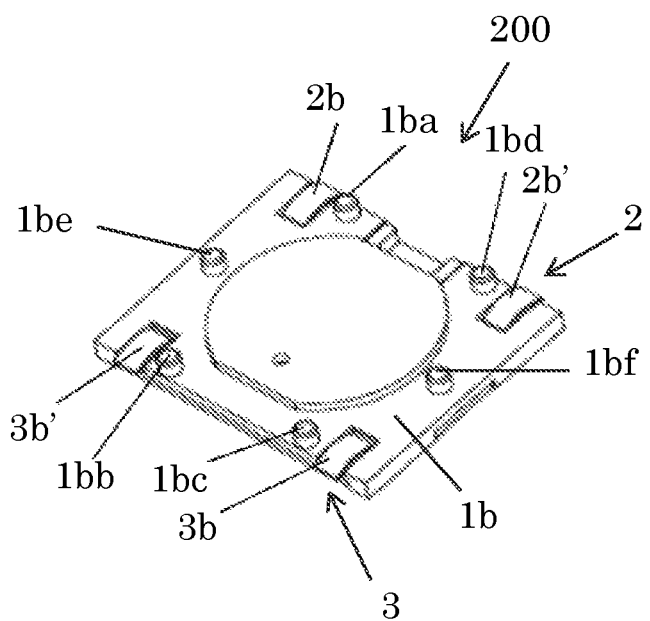
FIG. 4E is a perspective view of a bottom surface of the substrate of the push switch.
Figure 4F:
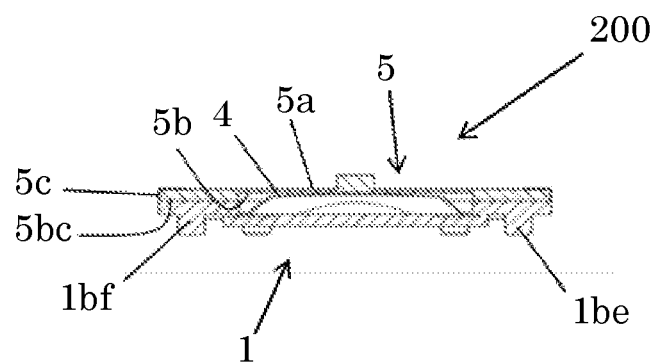
FIG. 4F is a cross-sectional view of the push switch taken along a dot and dash line IVF of FIG. 4B.

In FIG. 4D, a resilient member 4 in FIG. 4C is removed from the push switch 200.

As in FIG. 4D, the substrate 1 of the push switch 200 includes at least a pair of metal plates 2, 3 that includes a first metal plate 2 and a second metal plate 3. As in FIG. 4E, the substrate 1 of the push switch 200 also may include at least a pair of protrusions that include a first protrusion 1ba that is positioned adjacent to the first metal plate 2 and a second protrusion 1bb that is positioned adjacent to the second metal plate 3 (3b) at a lower surface 1b of the substrate 1. A first end portion 2a of the first metal plate 2 is positioned at an inner portion 1aa of an upper surface 1a of the substrate 1. A second end portion 2b of the first metal plate 2 is positioned adjacent to a lower surface 1b of the substrate 1. A first end portion 3a of the second metal plate 3 is positioned more adjacent to a center of the inner portion 1aa than the first end portion 2a (2a') of the first metal plate 2 (2'). A second end portion 3b (3b') of the second metal plate 3 is positioned adjacent to the lower surface 1b of the substrate 1. The push switch 200 further includes a resilient member 4 arranged on the first end portion 2a (2a') of the first metal plate 2(2') over the first end portion 3a of the second metal plate 3. The first metal plate 2 is partly embedded in the substrate 1. The second end portion 2b of the first metal plate 2 appearing from the lower surface 1b of the substrate 1 includes a curved portion. The second metal plate 3 is partly embedded in the substrate 1. The second end portion 3b of the second metal plate 3 appearing from the lower surface 1b of the substrate 1 includes a curved portion.

The curved portion of the second end portion 2b of the first metal plate 2 protrudes from the lower surface 1b of the substrate 1. The curved portion of the second end portion 3b of the second metal plate 3 protrudes from the lower surface 1b of the substrate 1.

The curved portion of the second end portion 2b of the first metal plate 2 is resilient. The curved portion of the second end portion 2b of the second metal plate 2 is resilient.

Accordingly, the second end portion 2b of the first metal plate 2 of the push switch 200 is resiliently and electrically in contact with the first electrode 11 (11a) of the motherboard 10 when the first protrusion 1ba of the lower surface 1b the substrate 1 of the push switch 200 fits into the first hole 13a of the motherboard 10. Also, the second end portion 3b of the second metal plate 3 of the push switch 200 is resiliently and electrically in contact with the second electrode 12(12a) of the motherboard 10 when the second protrusion 1bb of the lower surface 1b of the substrate 1 of the push switch 200 fits into the second hole 13b of the motherboard 10.

Therefore, the second embodiment of the push switch 200 is electrically mountable on a motherboard 2000 without a solder.

As shown in FIG. 4B, the push switch 200 further includes a light-transmitting member 5 that covers the resilient member 4 from above. The push switch 200 according to the second embodiment of the subject matter is electrically mountable on a motherboard without a solder, the light-transmitting member may include a silicone, which tends to be susceptible to a high-heat temperature that is 250° C. or more with the duration of heating for eight or more seconds, for example.

The light-transmitting member 5 of the push switch 200 covers the resilient member 4 from above. As in FIG. 4F, the light-transmitting member 5 includes an upper surface 5a, a lower surface 5b and a peripheral side surface 5c between edges of the upper surface 5a and edges of the lower surface 5b of the light-transmitting member 5, a periphery 5bc of the lower surface 5b of the light-transmitting member 5 is fixed on the upper surface 1a of the substrate 1. As in FIGS. 5A and 5C, the push switch 200 may include a light-emitting element 6 with a light-emitting surface 6a arranged to face a part of the periphery 5c of the light-transmitting member 5.

Figure 5A:
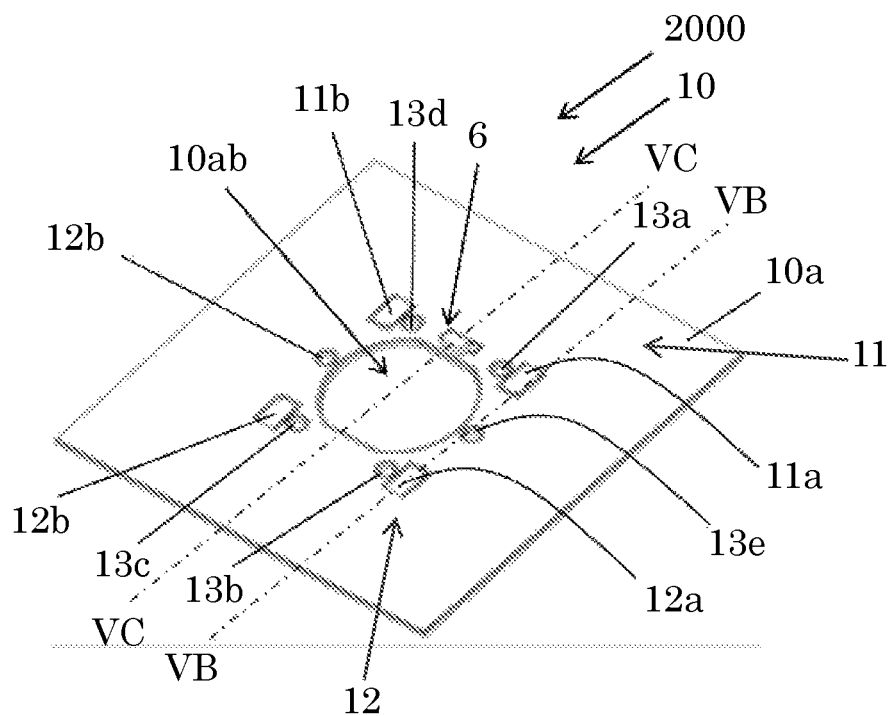
FIG. 5A is a perspective view of a motherboard of an electronic device. A light-emitting element is electrically mounted on the motherboard.
Figure 5B:
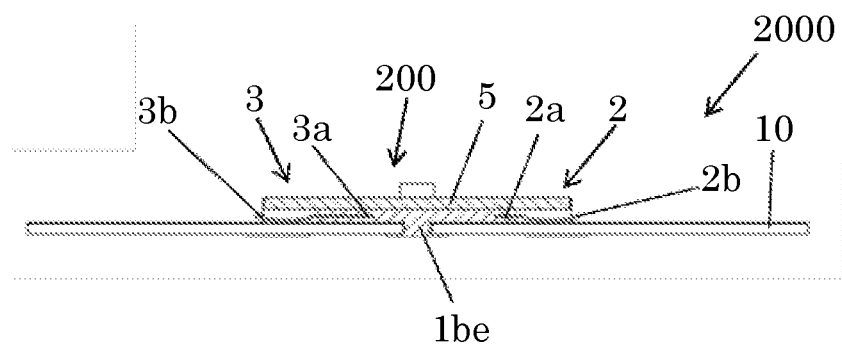
FIG. 5B is a cross-sectional view of the push switch of the second embodiment electrically mounted on the motherboard of the electronic device taken along a dot and dash line VB of FIG. 5A.
Figure 5C:
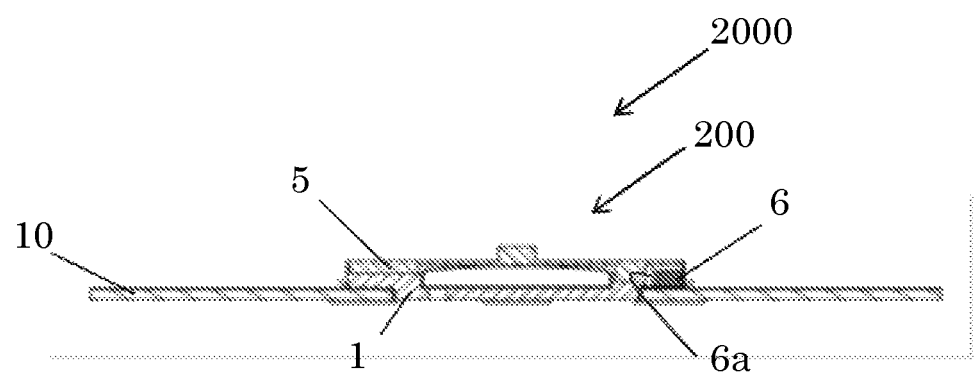
FIG. 5C is a cross-sectional view of the push switch of the second embodiment electrically mounted on the motherboard of the electronic device taken along a dot and dash line VC of FIG. 5A.

The motherboard of an electronic device in FIG. 5A may be a computer, a portable communication device, a wearable device, and/or a game console, for example.

The electronic device 2000 may include a motherboard 10. The motherboard 10 includes electrodes that include a first electrode 11 and a second electrode 12. The motherboard 10 includes at least a pair of holes including a first hole 13a that is positioned adjacent to the first electrode 11 (11a) and a second hole 13b that is positioned adjacent to the second electrode 12 (12a). Also, the first protrusion 1ba of the lower surface 1b of the substrate 1 of the push switch 200 in FIG. 4E fits into the first hole 13a and the second end portion 2b of the first metal plate 2 of the push switch 200 is resiliently and electrically in contact with the first electrode 11 of the motherboard 10. The second protrusion 1bb of the lower surface 1b of the substrate 1 of the push switch 200 in FIG. 4E fits into the second hole 13b and the second metal plate 3 of the push switch 200 that is resiliently and electrically in contact with the second electrode 12 of the motherboard 10. As in FIG. 5A, the first electrode 11 may include one or more first electrodes 11a, 11b. Also, the second electrode 12 may include one or more second electrodes 12a, 12b.

In the electronic device 2000, the first metal plate 2 of the push switch 200 and the first electrode 11 of the motherboard 10 may be electrically in contact with each other and free from solder. Also, the second metal plate 3 of the push switch 200 and the second electrode 12 of the motherboard 10 may be electrically in contact with each other and free from solder.

The motherboard 10 may include a mounting hole 10ab of the push switch 200. The lower portion of the push switch 200 may fit in the mounting hole 10ab of the push switch 200. With this configuration, the push switch 200 is more stably mountable on the motherboard 10.

A light-emitting element 6 may be electrically mounted on the substrate 1 of the push switch 200. Also, the light-emitting element 6 may be electrically mounted on the motherboard 10 as in FIG. 5A. With this configuration, it is possible to electrically mount the push switch 200 on the motherboard 10 such that the light emitting surface 6a of the light-emitting element 6 faces a part of the periphery 5c of the light-transmitting member 5.

The electronic device 2000 includes the motherboard 10 including electrodes that includes the first electrode 11 and the second electrode 12. The motherboard 10 of the electronic device 2000 further includes at least a pair of holes that include the first hole 13a that is positioned adjacent to the first electrode 11(11a) and the second hole 13b that is positioned adjacent to the second electrode 12(12a).

The electronic device 2000 includes the light-emitting element 6 electrically arranged on an upper surface 10a of the motherboard 10. As in FIG. 5C, the light-emitting element 6 includes a light-emitting surface 6a, which is arranged to face a part of the periphery 5c of the light-transmitting member 5, to emit light into the light-transmitting member 5.

The first protrusion 1ba of the lower surface 1b the substrate 1 of the push switch 200 fits into the first hole 13a of the motherboard 10, and the second end portion 2b of the first metal plate 2 of the push switch 200 is resiliently and electrically in contact with the first electrode 11 of the motherboard 10. The second protrusion 1bb of the lower surface 1b of the substrate 1 of the push switch 200 fits into the second hole 13b and the second metal plate 3 of the push switch 200 is resiliently and electrically in contact with the second electrode 12 of the motherboard 10.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A push switch comprising:
   a substrate comprising electrodes on an upper surface of the substrate, the electrodes comprising a first electrode and a second electrode;
   a resilient member arranged on the first electrode of the substrate over the second electrode of the substrate, the resilient member having no through hole;
   a light-transmitting member comprising an elastic film comprising a crosslinked product of a chain olefin-cyclic olefin copolymer, the light-transmitting member covering the resilient member from above, and having an upper surface, a lower surface and a peripheral side surface between edges of the upper surface and edges of the lower surface of the light-transmitting member; and a light-emitting element with a light-emitting surface, wherein a periphery of the lower surface of the light-transmitting member is fixed on the substrate, wherein the substrate has a cut portion at an edge of at least one side of an outer periphery of the substrate, the cut portion penetrating from the upper surface of the substrate to a lower surface of the substrate, and wherein the light-emitting element is arranged at a position at the cut portion of the substrate.

2. The push switch according to claim 1,
wherein the light-transmitting member transmits 80 percent or more light that is a visible light.

3. The push switch according to claim 2,
wherein the visible light is in a wavelength range of 400 nm to 800 nm.

4. The push switch according to claim 1,
wherein a vertical axis shows a load and a horizontal axis shows a displacement in a graph, when the graph shows a line graph that shows a load-displacement relationship of a center top portion of the resilient member, the light-transmitting member has a load-displacement characteristic, which is shown as a line graph that is positioned below a line connecting zero point on the vertical axis and the horizontal axis of the graph and a point of 50 percent of the load point where the center top portion of the resilient member starts to reverse.

5. The push switch according to claim 1,
wherein the light-transmitting member fits in a size range of 5 mm square to 6 mm square.

6. The push switch according to claim 1,
wherein the light-transmitting member comprises a central portion and a peripheral portion, and the central portion is thinner than the peripheral portion, and
wherein the light-transmitting member comprises a protruding portion at a center of the central portion on the upper surface of the light-transmitting member.

7. An electronic device comprising:
a motherboard comprising electrodes that comprise a first electrode and a second electrode; and
the push switch of claim 1 including a lower electrode of the first electrode soldered to the first electrode of the motherboard, a lower electrode of the second electrode soldered to the second electrode of the motherboard,
wherein the light-emitting element is electrically mounted on an upper surface of the motherboard.

8. A push switch comprising:
a substrate comprising:
at least a pair of metal plates that comprise a first metal plate and a second metal plate; and
at least a pair of protrusions that comprise a first protrusion that is positioned adjacent to the first metal plate, and a second protrusion that is positioned adjacent to the second metal plate,
wherein a first end portion of the first metal plate is positioned at an inner portion of an upper surface of the substrate, and a second end portion of the first metal plate is positioned adjacent to a lower surface of the substrate, and
wherein a first end portion of the second metal plate is positioned more adjacent to a center of the inner portion than the first end portion of the first metal plate and a second end portion of the second metal plate is positioned adjacent to the lower surface of the substrate;

a resilient member arranged on the first end portion of the first metal plate over the first end portion of the second metal plate, the resilient member having no through hole;

a light-transmitting member comprising an elastic film comprising a crosslinked product of a chain olefin-cyclic olefin copolymer, the light-transmitting member covering the resilient member from above; and a light-emitting element with a light-emitting surface, wherein the substrate comprises a cut portion at an edge of at least one side of an outer periphery of the substrate, the cut portion penetrating from the upper surface of the substrate to the lower surface of the substrate, wherein the light-emitting element is arranged at a position corresponding to the cut portion of the substrate, wherein the first metal plate is partly embedded in the substrate, and the second end portion of the first metal plate that appears from the lower surface of the substrate comprises a curved portion having an approximately arched shape and protruding below the lower surface of the substrate, wherein the first metal plate is partly embedded in the substrate, and the second end portion of the first metal plate that appears from the upper surface of the substrate comprises a curved portion having an approximately arched shape and is positioned lower than the upper surface of the substrate, wherein the second metal plate is partly embedded in the substrate, and the second end portion of the second metal plate that appears from the lower surface of the substrate comprises a curved portion having an approximately arched shape and protruding below from the lower surface of the substrate, and wherein the second metal plate is partly embedded in the substrate, and the second end portion of the first metal plate that appears from the upper surface of the substrate comprises a curved portion having an approximately arched shape and is positioned lower than the upper surface of the substrate.

9. The push switch according to claim 8, wherein the curved portion of the second end portion of the first metal plate is resilient.

10. The push switch according to claim 9,
wherein the curved portion of the second end portion of the second metal plate is resilient.

11. The push switch according to claim 8,
wherein the light-transmitting member comprises an upper surface, a lower surface, and a peripheral side surface between edges of the upper surface of the light-transmitting member and edges of the lower surface of the light-transmitting member, and
wherein a periphery of the lower surface of the light-transmitting member is fixed on the upper surface of the substrate, and the light-transmitting member seals the resilient member.

12. An electronic device comprising:
a motherboard comprising electrodes that include a first electrode and a second electrode and at least a pair of holes comprising a first hole that is positioned adjacent to the first electrode and a second hole that is positioned adjacent to the second electrode;
a light-emitting element with a light-emitting surface electrically arranged on the motherboard; and the push switch of claim 11,
wherein the first protrusion extends from the lower surface the substrate of the push switch and fits into the first hole, and the second end portion of the first metal plate of the push switch is resiliently and electrically in contact with the first electrode of the motherboard, and wherein the second protrusion extends from the lower surface of the substrate of the push switch and fits into the second hole, and the second metal plate of the push switch is resiliently and electrically in contact with the second electrode of the motherboard.

13. An electronic device comprising:

a motherboard comprising electrodes that include a first electrode and a second electrode and at least a pair of holes comprising a first hole that is positioned adjacent to the first electrode and a second hole that is positioned adjacent to the second electrode; and the push switch of claim 8, wherein the first protrusion extends from the lower surface of the substrate of the push switch and fits into the first hole, and the second end portion of the first metal plate of the push switch is resiliently and electrically in contact with the first electrode of the motherboard, and wherein the second protrusion extends from the lower surface of the substrate of the push switch and fits into the second hole, and the second metal plate of the push switch is resiliently and electrically in contact with the second electrode of the motherboard.

14. The electronic device according to claim 13, wherein the first metal plate of the push switch and the first electrode of the motherboard are electrically in contact with each other and free from solder.

15. The electronic device according to claim 13, wherein the second metal plate of the push switch and the second electrode of the motherboard are electrically in contact with each other and free from solder.

* * * * *

UNITED STATES PATENT AND TRADEMARK OFFICE
CERTIFICATE OF CORRECTION

PATENT NO. : 10,381,177 B2
APPLICATION NO. : 15/457002
DATED : August 13, 2019
INVENTOR(S) : Ryo Wakuda Page 1 of 1

It is certified that error appears in the above-identified patent and that said Letters Patent is hereby corrected as shown below:

In the Claims

In Claim 8, Column 10, Line 36, please delete "from".

Signed and Sealed this
Twenty-second Day of October, 2019

Andrei Iancu
*Director of the United States Patent and Trademark Office*